United States Patent [19]

Pohl et al.

[11] 4,156,605
[45] May 29, 1979

[54] FORMED PART OF SINTERED IRON AND METHOD AND SINTERING TILE FOR MAKING SAME

[75] Inventors: Dieter Pohl, Aalen; Franz Redlinger, Kuchen, both of Fed. Rep. of Germany

[73] Assignee: Schwäbische Hüttenwerke Gesellschaft mit beschränkter Haftung, Wasseralfingen, Fed. Rep. of Germany

[21] Appl. No.: 887,881

[22] Filed: Mar. 20, 1978

Related U.S. Application Data

[60] Division of Ser. No. 733,268, Oct. 18, 1976, Pat. No. 4,104,063, which is a continuation of Ser. No. 419,346, Nov. 27, 1973, abandoned.

[30] Foreign Application Priority Data

Nov. 29, 1972 [DE] Fed. Rep. of Germany ....... 2258310

[51] Int. Cl.² .............................................. B22F 3/00
[52] U.S. Cl. ..................................... 75/208 R; 75/200
[58] Field of Search .................. 75/243, 208 R, 200.3, 75/200 R

[56] References Cited

U.S. PATENT DOCUMENTS

| 3,741,734 | 6/1973 | Dunham | 428/547 |
| 3,771,974 | 11/1973 | Itakura et al. | 428/547 |
| 3,802,851 | 4/1974 | Dunham | 428/547 |

OTHER PUBLICATIONS

USS, The Making Shaping & Treating of Steel 1964, pp. 1033–1035.
Goetzel, Treatis on Powder Metallurgy vol. II, 1950, pp. 374–399.

Primary Examiner—Brooks H. Hunt
Attorney, Agent, or Firm—Becker & Becker, Inc.

[57] ABSTRACT

A formed part of sintered iron, and method and sintering tile for making same, according to which the formed part to be sintered for purposes of providing the same with an austenitic wear resistant surface is reacted during the sintering process with a substance from which at least at the sintering temperature austenite forming elements are diffused into the surface of the formed part.

13 Claims, 1 Drawing Figure

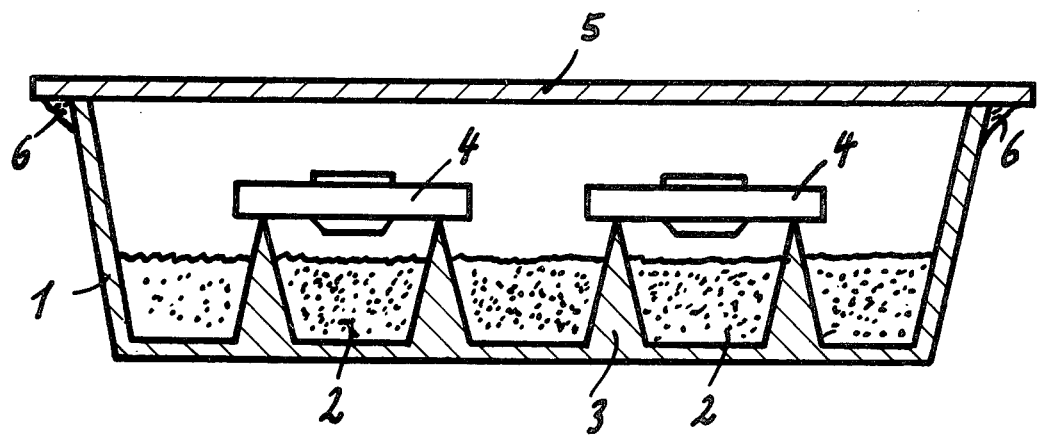

FORMED PART OF SINTERED IRON AND METHOD AND SINTERING TILE FOR MAKING SAME

This is a divisional of co-pending application Ser. No. 733,268—Pohl, et al filed Oct. 18, 1976 now U.S. Pat. No. 4,104,063 as a continuation of parent application Ser. No. 419,346—Pohl, et al filed Nov. 27, 1973 now abandoned.

The present invention relates to a formed part of sintered iron which has a wear resistant surface, and also concerns a method and a sintering tile for making such formed part. The invention is applicable to sintered iron metals which means to pure iron and to iron alloys.

The sintering technique as a manufacturing process is known, which permits the manufacture of formed parts with so narrow tolerances that the finished parts are as a rule obtained in a condition ready for installation. The conditions of use of sintered formed parts frequently require a wear resistant surface in order to increase their life span or staying time. Heretofore, for purposes of creating wear resistant surface layers, the case hardening, nitriding, carbon nitriding, and in less frequent instances inductive surface hardening have become known. The wear resistance which results from employing this method is based on a change in the structure of the surface layer. As a result of the hardening method, there is formed for instance martensite, the nitriding method brings about the formation of iron nitride. Finally, also parts of carbon containing sinter steel can be hardened through while in addition to the surface also the core of the workpiece becomes wear resistant. A further possibility consists in galvanically depositing wear resistant layers for instance hard chromium layers. All of these methods, however, require that in addition to the working operations necessary for the manufacture of sintered iron parts, additional working operations have to be carried out for obtaining the wear resistant surface layer. To this end, additional devices are necessary so that the costs of a sintered part are further increased in an undesired manner by one of the above mentioned post treatments.

A further drawback of the hardening methods referred to above consists in that the formed part may during the heat treatment for producing the wear resistant surface get warped or distorted so that the narrow tolerances which represent a particular advantage of the sintered metal formed parts are again increased. The sintered parts heat treated in this manner therefore have frequently to be subjected to a post treatment by chip removing which causes additional costs. With the sintered part hardened in customary manner, it is also highly disadvantageous that these sintered parts due to the high strength of the marginal layers cannot be roll pass designed and therefore in most instances have to be post treated by a chip removing operation.

It is, therefore, an object of the present invention to provide sintered formed parts, and a method of making same which will overcome the above outlined drawbacks.

This object and other objects and advantages of the invention will appear more clearly from the following specification in connection with the accompanying drawing diagrammatically illustrating a section through a sintering tile for carrying out the method according to the invention.

The formed part of sintered iron according to the invention with wear resistant surface is characterized primarily by a surface layer of an austenitic structure.

Such austenitic surface layers the characterizing structure component of which consists of cubic surface sintered iron, so-called austenite, are highly wear resistant. The method according to the invention has the great advantage that the high final hardness can be obtained by calibrating or by roll designing.

Austenitic surface layers can be obtained with nickel or copper or with manganese alone or in combination. Preferably, the surface layer has a composition which corresponds to that of an austenitic manganese hard steel. The generation of an austenitic layer with manganese is advantageous insofar as the other mentioned elements are more expensive than manganese. Furthermore, it is advantageous when the austenite-surface layer is cold work hardened. Austenite as such has already a certain hardness. The hardness may, however, be greatly increased by cold work hardening so that the surface layer becomes wear resistant. The cold work hardening can be effected by the customary hardening of a formed part. This property is known, when making machine parts of manganese hard steel, as work hardening. With a formed part of sinter iron according to the present invention, only the surface layer consists of an austenitic steel, whereas the core of the formed part consists of the customary sinter iron alloy. The surface layer is made preferably by diffusing the austenite forming alloy elements into the surface of the formed part. Diffusion is the most simple possibility of entering into the surface of the formed part those elements which are necessary for the formation of austenite. The method according to the invention for making a formed part of sinter is characterized primarily in that the formed part, for purposes of creating an austenitic wear resistant surface layer, is during a sintering process brought into reaction with a substance from which at least at the sinter temperatures, austenite forming elements diffuse into the surface of the formed part. Therefore, due to the method according to the invention, there is, (by diffusion on sintered formed parts of iron and iron alloys) generated air austenitic surface layer which is characterized primarily by its cold hardening ability.

The advantage of the method according to the invention is seen in that when practicing said method, no additional devices are necessary other than those which are anyhow present when making sinter iron. No additional heat treatment is necessary. The surface layer is created during the sintering operation which means when inert gas annealing at temperatures preferably between 1,000° and 1,300° C. Each sintering iron formed part has anyhow to go through this sintering process. Consequently, the method according to the invention is considerably less expensive than any heretofore known treating and hardening method. A further advantage is seen in the fact that the method according to the invention can be practiced in any customary sintering atmosphere, in a vacuum and, when employing completely tightly closed sintering tiles, even in air and other atmospheres. It is merely necessary to see to it that the material of the tile will not be attacked by the respective atmosphere. When carrying out the method in air, it is suggested that the tile consists of high heat resistant steel. In order to provide sintered iron parts with a wear resistant surface layer of manganese steel, a substance is necessary from which it is possible to diffuse manganese and carbon into the formed part. As such substance a substance has been found particularly advantageous which consists of the following example:

from 0.1 to 10% of a carburizing agent;
from 0.1 to 25% of thermally disassociating carbonate;
from 0.1 to 30% of halogen salts;
from 1.0 to 20% of silicon oxide or aluminum oxide;
remainder ferromanganese.

Under certain circumstances, the carbonizing agent need not be employed if ferromanganese is used with sufficient carbon content. The substance will then be a mixture for example of:

from 0.1 to 25% of thermally disassociating carbonate;
from 0.1 to 30% of halogen salts;
from 0.1 to 20% of silicon or aluminum oxide;
remainder ferromanganese with from 5 to 10% carbon.

As carbonizing agents there may be used active carbon, charcoal, bone coal, coke powder and any other carbonizing agents customary in the art. Active carbon, however, is preferred particularly in view of its purity and its large surface. As thermally disassociating carbonate, barium carbonate, as well as all other carbonates are suitable which at the sintering temperature will thermally disassociate in carbon dioxide and other molecule residues.

As halogen salts there may be used principally all chlorides which at the sintering temperature thermally disassociate in chlorine ion and a molecule residue. The chlorides may also be replaced by other halogen salts for instance fluorides, bromides or iodides. However, ammonium salts, especially ammonium chloride are preferred inasmuch as they have the advantage of disintegrating in a halogen residue (chloride, fluorine, bromine or iodine) and ammonia. As a result thereof, additionally a nitrogen enrichment (Aufstickung) of the treated formed parts takes place. The nitrogen enrichment is advantageous in as much as due to the nitrogen, the austenite is additionally stabilized.

The aluminum oxide or silicon oxide serve as indifferent substances for preventing a sintering together of the mixture which gives off the austenite forming elements. Fundamentally, to this end any substance may be utilized which has this effect.

It is advantageous to use as austenite forming substance a powder with a granular size of from 0–5 mm, preferably from 0–6 mm so that as far as possible a maximum active surface is obtained from which in response to the heating of the substance to sintering temperature of the formed part, the austenite forming elements can separate.

As an example a substance has proved highly satisfactory for practical purposes, which consists of:

from 4 to 6% active carbon;
from 5 to 8% of barium carbonate;
from 10 to 20% of ammonium chloride;
from 4 to 8% of aluminum oxide;
and the remainder ferromanganese.

Into this mixture or the substance which gives off the austenite forming elements, there are packed the powder pressed, in other words not yet sintered parts to be formed and are then subjected to the customary sintering process. During the sintering process there will simultaneously be formed the desired austenitic surface layer without the necessity of taking additional steps. The surface of the formed parts will, however, be somewhat rougher than customary for sintered parts because the mixture has the inclination to stick. When the parts are fully surrounded by a powder mixture, also the evaporation of lubricants, for instance of stearates, will be made somewhat more difficult which are usually added to sinter powders for facilitating the form pressing. In instances in which this limitation is, however, not objectionable, the packing of the form parts into the active mixture represents the most simple and lease expensive method of making formed parts according to the invention.

If, however, the above mentioned limitations should be objectionable, the sintering process has to be carried out in such a way that the formed parts will not come into direct contact with the mixture. To this end, a closed reaction chamber is necessary in which the austenite forming elements diffuse from the mixture through the gaseous phase into the formed part. This may occur for instance in a sinter tile as it is diagrammatically shown in the drawing.

With reference to the drawing, a glow tile or sinter tile 1 contains the powder mixture 2 which gives off the manganese and carbon, said mixture 2 being spread at the bottom of the tile 1. Furthermore, provided at the bottom of the tile are spacer members in the form of ribs 3, the tips of which extend beyond the powder mixture 2. Located on said ribs 3 are the pressed bodies 4 from which by sintering the form parts are formed. The sinter tile 1 is closed by a cover 5 which is sealed by any thermally resistant mass 6. The escape of manganese and carbon from the active mixture as well as the diffusing of the manganese of the carbon into the pressed bodies 4 is in this instance effected through the gas phase during the sintering operation.

The sintering temperature is the customary temperature of from 1,000° to 1,300° C. customary in connection with the manufacture of sintered iron parts. Also the sintering time corresponds to the customary values of from about 20 minutes to one hour. The thus treated formed parts are characterized by a smooth surface customary for sintered carbon parts, and for the wear resistant surface layer according to the invention with an austenite structure.

Following this working operation, the surface hardness of the formed parts amounts to approximately $HV=200\ldots 300$. The hardness desired for the required wear resistance can be imparted upon the dormed parts by subjecting them to use (work hardening). Sinter formed parts are, however, generally calibrated after the sintering operation for obtaining better tolerances. Inasmuch as the calibration brings about a cold deformation in the surface, it will be appreciated that as a result thereof with formed parts according to the invention which during the preceding sintering operation have obtained an austenitic surface layer, a considerable increase in hardness if effected up to $HV=600-700$. Also in this instance an additional working operation is not necessary because the major portion of all sinter formed parts anyhow is subjected to a calibration. The calibration brings about a partial conversion of the austenite to martensite.

Practical tests have proved that by means of the method according to the invention, contour true austenitic surface layers are obtained. The chemical composition corresponds approximately to the Hatfield manganese hard steel. The analysis resulted in 0.6 ... 1.8% C and 10 ... 15% Mn.

It is, of course, to be understood that the method according to the present invention is, by no means, limited to so-called green workpieces, i.e. not yet sintered workpieces, but is also applicable to provide formed parts, which have already been sintered in conformity with the heretofore customary methods, with an austenitic surface layer. In such an instance, a second sintering process in conformity with the present invention is necessary which may then be followed by a calibrating process.

It is also to be understood that the present invention is not limited to the specific method set forth in connection with the drawing but also comprises any modifications within the scope of the appended claims.

What we claim is:

1. A method of making a part, with a wear-resistant surface layer which includes the steps of: forming pulverous sinterable iron into the desired part, and sintering the said part while simultaneously adding manganese to a surface layer to form an austenitic alloy, and thereby hardening said surface layer to a greater hardness than the body of said part.

2. A method as claimed in claim 1, in which said part is sintered in the presence of a substance containing manganese to form said surface layer.

3. A method as claimed in claim 2, in which said substance is spaced from said part, said substance being volatilized to diffuse into said surface layers.

4. A method according to claim 3, in which said substance consists of a mixture of from 0.1–10% of a carburizing agent
from 0.1–25% of thermally disassociating carbonate
from 0.1–30% of halogen salts
from 1.0–20% silicon oxide or aluminum oxide
remainder—ferro manganese.

5. A method according to claim 4, in which as carburizing agent active carbon is employed.

6. A method according to claim 4, in which as thermally disassociated carbonate barium carbonate is employed.

7. A method according to claim 4, in which as halogen salt ammonium halogenide is used.

8. A method according to claim 3, in which the substance is formed by a mixture of from 0.1–25% of thermally disassociating carbonate
from 0.1–30% of halogen salts
from 1.0–20% silicon oxide or aluminum oxide
remainder—ferro manganese with from 5–10% carbon.

9. A method according to claim 3, in which said substance consists of from 4–6% active carbon
from 5–8% barium carbonate
from 10–20% aluminum chloride
from 4–8% aluminum oxide
remainder—ferro manganese.

10. A method according to claim 3, in which said substance consists of a powder with a granular size of between 0 and 6 millimeters.

11. A method according to claim 3, in which said object is further surface hardened by work hardening.

12. A method according to claim 3, with the further step of working hardening said surface layer.

13. A method according to claim 3, with the further step of hardening said surface layer by a calibrating process.

* * * * *